United States Patent [19]

Houser

[11] Patent Number: 5,584,617
[45] Date of Patent: Dec. 17, 1996

[54] SINGLE FLUTE DRILL FOR DRILLING HOLES IN PRINTED CIRCUIT BOARDS AND METHOD OF DRILLING HOLES IN A PRINTED CIRCUIT BOARD

[75] Inventor: David E. Houser, Apalachin, N.Y.

[73] Assignee: International Business Machines Corporation, Armonk, N.Y.

[21] Appl. No.: 417,062

[22] Filed: Apr. 4, 1995

[51] Int. Cl.⁶ .............................. B23B 51/02; B23B 41/14
[52] U.S. Cl. ........................ 408/1 R; 408/230; 408/704; 408/705
[58] Field of Search ............................ 408/83, 229, 230, 408/704, 705, 715

[56] References Cited

U.S. PATENT DOCUMENTS

| 4,561,813 | 12/1985 | Schneider | 408/230 |
| 4,722,644 | 2/1988 | Scheuch | 408/230 |
| 5,380,133 | 1/1995 | Schimmer | 408/230 |

FOREIGN PATENT DOCUMENTS

| 3317989 | 11/1984 | Germany | 408/230 |
| 306112 | 12/1989 | Japan | 408/704 |
| 306111 | 12/1989 | Japan | 408/704 |
| 665979 | 6/1988 | Switzerland | 408/230 |
| 1767152 | 7/1989 | U.S.S.R. | |

OTHER PUBLICATIONS

American National Standards Institute, Publication — IPC–DR–570, General Specification for 1/8 Inch Diameter Shank Carbide Drills For Printed Circuit Boards, Jan., 1979.

*Primary Examiner*—Steven C. Bishop
*Attorney, Agent, or Firm*—Pollock, Vande Sande & Priddy

[57] ABSTRACT

A drill bit for forming holes in a printed circuit board. The drill bit includes a first end including a tip for contacting the material of the circuit board. A second end of the drill bit is attached to apparatus for rotating the drill bit. A cutting edge is in the vicinity of the first end. A pressure pad is opposite the cutting edge. A flute winds upwardly about the drill bit in a helix. An angle of the helix with respect to a longitudinal axis of the drill bit varies continuously, wherein the angle is about from about 15° to about 35° in the vicinity of the first end and increases with increasing distance from the first end to at least from about 35° to about 65°.

10 Claims, 1 Drawing Sheet

SINGLE FLUTE DRILL FOR DRILLING HOLES IN PRINTED CIRCUIT BOARDS AND METHOD OF DRILLING HOLES IN A PRINTED CIRCUIT BOARD

FIELD OF THE INVENTION

The invention relates to a drill bit for drilling holes in printed circuit boards and to a method of drilling holes in a printed circuit board.

BACKGROUND OF THE INVENTION

Formation of holes is an essential part of the formation of printed circuit boards. Drilled holes typically are plated with an electrically conducting material. The holes then may or may not receive conductors, for example pins, attached to chips, chip holders, or other components to be attached to the circuit board.

The electrically conducting plating material is electrically connected to electrically conducting planes within the circuit board. Therefore, when the conductors of the chips, chip holders, or other components are attached to the plated holes, the holes provide electrical connections among the chips, chip holders, other components of the board, and/or the device that the circuit board is incorporated into or other components incorporated into the device. Accordingly, it is important that the holes be drilled with great accuracy and are uniform in their dimensions. Variations in the surface of the hole or location of the hole could result in poor quality plating, poor, missing, or misplaced electrical connections, and ill fitting components, among other things.

Poor hole quality may result from many causes. The causes of poor hole quality encountered in drilling holes in circuit boards include damage caused by drill bit breakage, damage caused by impact of material removed by the drill, in particular damage from copper chips removed from electrically conducting layers of the circuit board such debris can buckle and gouge the wall of the hole being drilled. Additionally, the compaction of debris in the drill flute and the drill itself have been known to cause heating of the wall and, thereby softening of the wall, also leading to poor hole quality.

Another component of the problems encountered in drill holes in printed circuit boards is drill "smear". Drill smear occurs when a layer of resin from the circuit board is redeposited on the hole wall. This smear can be difficult to remove, especially if excessive. Drill smear can lead to unreliable connections between the subsequently applied plating on the hole wall and the conductive planes in the printed circuit board. This heating and smearing are particularly acute in high aspect ratio holes (holes having a high length to diameter ratio) because the chips have to travel a long distance rubbing against the hole wall before they are finally evacuated.

The problem of drill breakage not only may cause damage to the circuit board, but is a significant problem in and of itself. Drill bit damage costs money to replace broken drill bits and damaged circuit boards and time in replacing the drill bit, among other problems.

Typical drill bits currently used in forming holes in printed circuit boards include two flutes.

Typical solutions presently employed to address problems encountered in drilling high aspect ratio holes include peck drilling. According to the peck drilling method, a hole is drilled step-wise by applying the drill to the circuit board and removing some material, thereby starting a hole. Then, the drill is retracted from the hole. Next, the drill reenters the hole and removes more material. The drill then retracts from the hole again. This process is repeated until a hole of the desired depth is formed.

Only engaging the circuit board material for a brief period of time helps to prevent a compaction in the flute of chips of the circuit board material removed by the drill. However, peck drilling requires a great deal of time since drilling each hole requires the drill and/or the circuit board to be moved a plurality of times to drill each hole. Peck drilling has also failed to produce holes of sufficient quality in some circuit board materials.

Accordingly, the present inventors recognized the desirability of developing a drill bit that could drill holes of a desired quality in any circuit board, regardless of the material used to form the circuit board, in a single pass.

SUMMARY OF THE INVENTION

An object of the present invention is to provide a drill bit for drilling holes in printed circuit boards.

Another object of the present invention is to provide a drill bit for drilling holes in printed circuit boards with a reduced incidence of breakage of the drill bit.

An additional object of the present invention is to provide a drill bit capable of drilling holes in printed circuit boards in a single stroke.

It is a further object of the present invention to provide a drill bit that formed better quality holes than known drill bits for drilling holes in printed circuit boards.

Also, an object of the present invention is to provide a drill bit that provides more accurate hole locations than standard drills particularly when a double pass process, a process that utilizes a pilot hole to start the drill bit on center, is used.

A further additional object of the present invention is to provide a drill bit capable of forming holes of a desired quality in a variety of circuit board materials.

In accordance with these and other objects of the present invention, according to preferred aspects, the present invention provides a drill bit for forming holes in a printed circuit board. The drill bit includes a first end including a tip for contacting a surface of the circuit board. An apparatus for rotating the drill bit may be attached to a second end of the drill bit opposite the first end. The drill bit includes a cutting edge in the vicinity of the first end. A single flute winds upwardly about the drill bit in a helix. The angle of the helix with respect to a longitudinal axis of the drill bit varies continuously along the entire length of the flute. The angle of the helix with respect to the longitudinal axis of the drill bit varies from about 15 degrees to about 35 degrees in vicinity of the first end to from about 35 degrees to about 65 degrees in the vicinity of the end of the flute opposite the first end of the drill bit.

According to other preferred aspects, the present invention provides a method of forming holes in a printed circuit board. The method includes the step of providing a drill bit with a first end including a tip for contacting a surface of the circuit board, a second end for attaching to an apparatus for rotating the drill bit, a cutting edge in the vicinity of the first end, a pressure pad extending at least partially about an outer surface of the drill bit in the vicinity of the first end, and a flute winding upwardly about the drill bit in a helix. An angle of the helix with respect to a longitudinal axis of the drill bit varies continuously along the entire length of the flute, wherein the angle is from about 15 degrees to about 35 degrees in vicinity of the first end and from about 35 degrees to about 65 degrees at an end of the flute farthest from the first end of the drill bit. The method also includes rotating the drill bit and bringing the tip of the drill bit into contact with a surface of the printed circuit board. According to the method, a hole is formed in the circuit board by moving at least one of the drill bit and the circuit board toward the other in a direction parallel to the longitudinal axis of the drill bit, thereby forcing the drill bit into the circuit board and causing the cutting edge of the drill bit to remove material from the circuit board. Then, at least one of drill bit and the circuit board is moved away from the other in a direction parallel to the longitudinal axis of the drill bit, thereby removing the drill bit from the formed hole.

Still other objects and advantages of the present invention will become readily apparent to those skilled in this art from the description contained herein wherein it is shown and described only the preferred embodiments of the invention, simply by way of illustration of the best mode contemplated of carrying out the invention. As will be realized, the invention is capable of other and different embodiments, and its several details are capable of modifications in various respects, without departing from the invention. Accordingly, the drawings and description are to be regarded as illustrative in nature and not as restrictive.

DETAILED DESCRIPTION OF VARIOUS AND PREFERRED EMBODIMENTS

Figure 1:
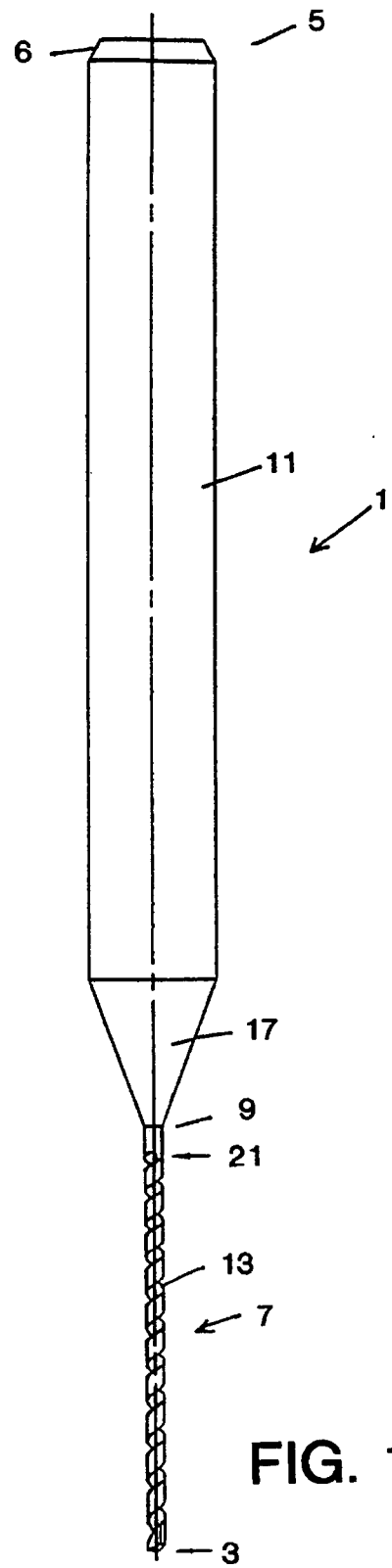
FIG. 1 represents a side view of an embodiment of a single flute drill bit according to the invention.

As shown in FIG. 1, a drill bit 1 according to the present invention includes a first end 3 and a second end 5. For forming holes, the drill bit includes a cutting edge and a fluted chip removal section toward the first end 3. An apparatus for rotating the drill bit 1 is attached to the drill bit in the vicinity of the second end 5.

In the embodiment shown in FIG. 1, the second end of the drill bit may be beveled. The bevel 6 is to ease insertion into the rotation device. However, the end of the drill bit may not be beveled, it may, instead, be rounded or have sharp corners.

The second end may include an extended shank portion 11 for engaging a rotation apparatus. The shank may have any shape. For example, the shank 11 may have a circular cross-section or a square cross-section. The shape of the shank 11 may depend upon the specific rotation apparatus employed and the chuck or other apparatus for receiving the drill bit on the rotation apparatus.

In the embodiment shown in FIG. 1, the shank 11 is wider than the hole forming portion of the drill bit. Accordingly, a transitional section 17 is interposed between the shank 11 and the hole forming and chip removal portion 7. In the embodiment shown in FIG. 1, the transitional section 17 is frustoconically shaped. Such a transition may provide the drill bit with greater strength. However, the transitional section 17 may be of any shape. The hole forming and chip removal portion 7 of the drill bit 1 meets the transitional section 17 at the intersection 9.

The apparatus for rotating the drill bit may be any known apparatus for rotating any object. Examples of commonly used apparatuses include electrically driven air bearing spindles or air turbine driven air bearing spindles, such as those made by Westwind. The operating parameters of the apparatus, particularly the rotation speed, are discussed in greater detail below.

The drill bit includes a hole forming and chip removal portion 7 extending between the shank portion 11 or the transitional portion 17 and the first end of the drill bit 3. The length of the hole forming and chip removal portion 7 may vary, depending, in part, upon the thickness of the circuit board being drilled through and the depth of the holes being formed. According to preferred embodiments, the length of the hole forming and chip removal portion 7 is from about 0.5 mm to about 12 mm.

Similarly, the width of the hole forming and chip removal portion 7 may vary, depending, in part, upon the diameter of the holes being drilled in the circuit board. According to preferred embodiments, the maximum width of the hole forming and chip removal portion 7 may be from about 0.04 mm to about 6 mm. However, the width of the hole forming and chip removal portion 7 may vary among locations on the hole forming and chip removal portion, as described below in more detail.

The hole forming and chip removal portion 7 of the drill bit 1 includes a single flute 13. The flute 13 is a helical recess in the surface of the drill bit 1 that extends away from the first end 3 of the drill bit 1 to a point further up the drill bit in the vicinity of the intersection 9 between the shank portion 11 and the hole forming and chip removal portion 7. Drill bits currently used for forming holes in circuit boards typically include two or more flutes.

The flute 13 of the drill bit 1 may be described using a variety of measurements. For example, the flute may be described by the size of the angle 16 formed by a line 17 parallel to the helix of the flute 13 and the longitudinal axis 17 of the drill bit 1. The flute 13 may also be described by the depth of the helix, in other words, the distance 19 between an exterior surface of the drill bit 1 and the surface of the helix. Furthermore, the flute 13 may be described by the width of the helix, or, in other words, the distance 20 along a line perpendicular to the line 17 between opposite edges of the flute.

In addition to including only one flute, the helix of the drill bit of the present invention is distinguished from drill bits currently being employed to drill holes in circuit boards by including a flute 13 with an angle 16 that varies continuously, throughout the entire length of the flute. The rate of variation of the angle 16 may vary, depending upon the location on the flute or the rate of variation may be constant over any portion of the flute. Additionally, the rate of variation may vary from minute to very large.

Preferably, the angle between the helix of the flute and the longitudinal axis increases with increasing distance away from the first end 3 of the drill bit. Therefore, a starting angle of the flute in the vicinity of the first end of the drill bit 1 is larger than the exit angle in the vicinity of the termination 21 of the flute 13. The starting angle may vary, thereby varying the exit angle in the vicinity of the termination 21 of the flute 13.

The exact angle of the helix with respect to the longitudinal axis of the drill bit may vary depending upon the application, including, among other factors, the material of the circuit board, and the effect that is desired to be created during the drilling of a material. For example, the starting angle of the helix may vary from about 15° to about 35°. According to a preferred embodiment of the drill bit, the angle 16 between the helix 13 and the longitudinal axis 17 of the drill bit 1 is about 28 degrees.

Similarly, the angle between the helix of the flute and the longitudinal axis of the drill bit at the termination 21 of the flute 13, or exit angle, may vary, depending upon the application, including, among other factors, the material of the circuit board, and the effect that is desired to be created during the drilling of a material. For example, the exit angle of the helix may vary from about 35° to about 65°. According to a preferred embodiment of the drill bit, the angle 16 between the helix 13 and the longitudinal axis 17 of the drill bit 1 is about 59 degrees.

As stated above, the rate of change of the angle may vary between drill bits. Also, the rate of change vary over the length of the helix, depending upon the location along the flute. The rate of change may vary, depending upon the application, including, among other factors, the material of the circuit board, and the effect that is desired to be created during the drilling of a material. The rate of change of the helix angle 16 may vary from about −5° per millimeter to about 220° per millimeter. Therefore, the angle of the helix may also decrease at points along the helix.

In embodiments in which the rate of change of the helix angle varies over the helix, the angle may vary from about −5° per millimeter to about 220° per millimeter. The rate of change may be greater at any location along the drill bit. Therefore, in some embodiments, a large percentage of the change in the helix angle may take place over a shorter percentage of the length of the flute.

According to one embodiment, the helix angle 16 changes relatively quickly in the vicinity of the first end of the drill bit. For example, more than half of the difference between the starting helix angle in the vicinity of the first end 3 of the drill bit and the exit angle in the vicinity of the termination 21 of the flute may take place over less than one-quarter of the distance of the flute.

In particular, in one embodiment, the starting helix angle is about 28°. About 87 percent of the variation of the angle occurs over approximately eleven percent of the length of the flute. In other words, the angle of the helix increases from about 28° to about 55° over about 1.2 millimeters.

Therefore, in this embodiment, about 13 percent of the total change in the helix angle occurs over the remaining 89 percent of the helix. In other words, the angle increases from about 55 degrees to about 59 degrees over about 9.6 millimeters. In this embodiment, the variation in the helix angle over the first eleven percent or over the remaining 89 percent may be constant or may vary.

Figure 2:
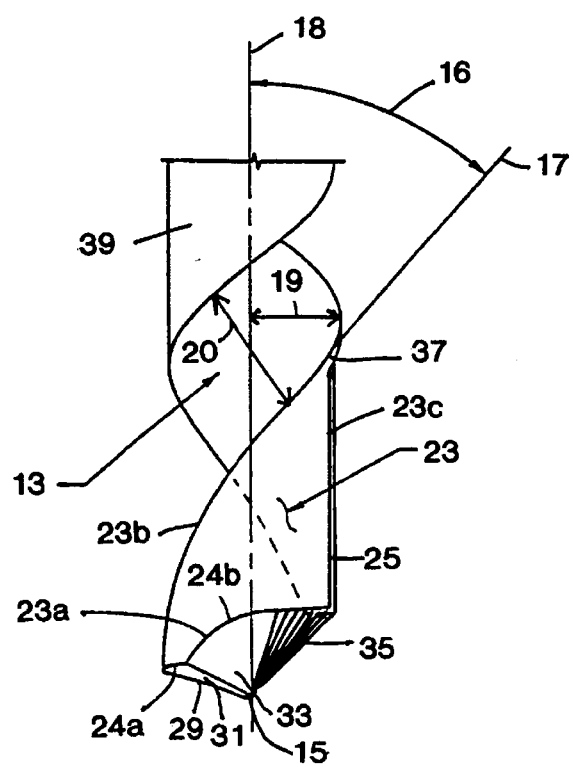
FIG. 2 represents a close-up side view of the first end of the embodiment of the drill bit shown in FIG. 1.

As shown in FIG. 2, a drill bit according to the present invention preferably includes a pressure pad 23 in the vicinity of the first end 3 of the drill bit 1. The pressure pad 23 is an area of the exterior surface of the drill bit bounded by the intersection 23a of the outer surface of the drill bit with the tip area 15 of the drill bit, where the flute meets the tip and cutting edge. The pressure pad is also bounded by the edge 23b of the flute 13, where the flute intersects the outer surface of the drill bit. The remaining boundary of the pressure pad 23c is formed by the intersection of the pressure pad with a beginning of an area of the surface 25 of the drill bit having a reduced diameter. As shown in FIG. 2, the pressure pad is somewhat triangularly shaped.

The edges of the pressure pad may have a variety of contours. For example, the edge 23a in the embodiment shown in the Figures includes two distinct portions 24a and 24b. These two portions represent the intersection between the pressure pad and two distinct portions of the tip 15. The edge 23a of the pressure pad may comprise one section having a circular or other contour, or may comprise more than two sections. Similarly, the other edges 23b and 23c of the pressure pad 23 may have contours other than those on the embodiment shown in FIGS. 1–3.

Figure 3:
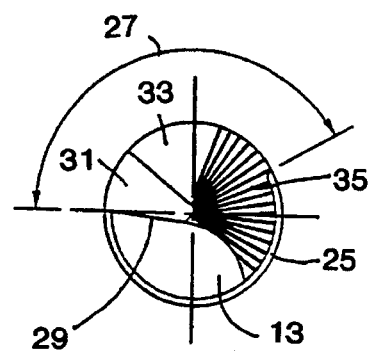
FIG. 3 represents a close-up end view of the embodiment of the drill bit shown in FIGS. 1 and 2.

As shown in FIG. 3, the pressure pad is at the full diameter, or widest portion, of the hole forming and chip removing portion 7 of the drill bit. As stated above, one edge 23c of the pressure pad is formed by the intersection of the pressure pad 23 with an area of reduced diameter 25. The extent of the area of reduced diameter 25 and other areas of full diameter are discussed in more detail below.

The pressure pad may extend about the drill bit any amount. Accordingly, the pressure pad angle 27, as shown in FIG. 3, is defined by determining the distance about the drill bit from furthest extension of the edges of the pressure pad. The pressure pad angle 27 may vary from about 45° to about 180°, depending upon the desired effect. However, preferably, the pressure pad extends less than 180° about the surface of the drill bit.

The pressure pad may have many functions, among them, is to provide, by pressing on the hole wall, a reaction force to balance the force acting on the cutting edge 29 of the tip of the drill.

Preferably, the pressure pad is fairly large, to distribute the reaction force over a larger area. However, preferably, the angle 27 of the pressure pad is less than 180°. Among other things, a pressure pad having an angle less than 180° reduces the incidence of jamming of the tip of the drill in the hole. Reducing the incidence of jamming reduces the incidence of drill bit breaking. Also, the incidence of jamming and breaking may be reduced by reducing the revolutions per minute that the drill bit is operated at thereby permitting the employment of a larger pressure pad.

Because of the force on the cutting edge, the pressure pad of the present invention is always in contact with or loaded against the hole wall. This makes a drill bit according to the present invention less susceptible to being knocked off course when encountering a discontinuity in the circuit board, such as a glass bundle. Therefore, a drill bit according to the present invention exhibits less wander off center as it drills through a thick panel than standard multiple flute drill bits. The wandering is particularly reduced when the present invention is used to drill holes when using a pilot hole, as described below.

A pilot hole may also provide the present invention with a more accurate start. The present invention may encounter some difficulties in starting a hole due to its asymmetric configuration, having only a single flute. The start up difficulties may manifest themselves particularly when the surface of a circuit board is uneven.

As shown in FIGS. 2 and 3, the tip 15 of the drill bit 1 of the present invention is provided with a cutting edge 29. The cutting edge may be straight, as shown in FIGS. 2 and 3. On the other hand, the cutting edge may have another contour. For example, the cutting edge could be rounded in an X and/or Y direction. Also, the angle of the cutting edge with respect to the longitudinal axis of the drill bit could vary from about 90° to about 45°.

The cutting edge 29 may be formed according to known methods for forming drill bit cutting edges. Adjacent the cutting edge 29 may be a primary relief portion 31. The primary relief portion may intersect a secondary relief portion 33. The secondary relief portion 33 may then intersect a continuing relief portion 35.

The relief portions function to reduce friction between the drill bit tip and the base of the hole in the circuit board.

The primary relief portion 31 and secondary relief portion 33, in the embodiment shown in FIGS. 2 and 3 are planar. On the other hand, the secondary relief 33 portion gently curves up the drill bit, where it intersects with the flute 13. The number, shape, and other characteristics of the relief portions may vary from those shown in FIGS. 2 and 3. For example, the primary relief angle could vary from about 5° to about 20°. However, the primary and secondary relief portions may vary in any way so that they do not drag on the bottom of the hole as the cutting edge cuts the hole.

As stated above, the drill bit may include other full diameter portions in addition to the pressure pad 23. For example, the drill bit may include a full diameter portion 37. As shown in FIG. 2, the full diameter portion 37 may be at the intersection of the upper edge of the flute with the side of the drill bit. This may help to prevent chips or pieces of chips from entering the space between the drill bit and the hole wall. In some embodiments, the entire outside surface of the drill bit may be full diameter.

The full diameter portion 37 may be continuous with the pressure pad 23 as shown in FIG. 2. Alternatively, the full diameter portion 37 may be discontinuous with the pressure pad 23. In the embodiments shown in FIGS. 1–3, the full diameter portion 37 winds all the way up the flute, to the termination of the flute 21. Additionally, the height of the full diameter portion 37, from the intersection with the upper edge of the flute to the edge where the reduced diameter section begins may be from about 10 μm to about 100 μm. In other embodiments, the full diameter portion may be thicker, may be in more than one section, and may extend less that the entire length of the flute.

The reduced diameter portion of the land 25, may begin at the pressure pad 23 and extend up the rest of the flute. This entire area may be reduced diameter or only portions may be of reduced diameter. The reduced and/or full diameter portions may or may not be continuous.

According to one embodiment, the diameter of the flute portion of the drill bit is about 0.018 inch, the distance 19 varies from about 0.0075 inch to about 0.0085 inch, the distance 20 varies from about 0.013 inch to about 0.025 inch, the overall length of the drill from tip to tip is about 1.5 inches, and the shank diameter is about 0.125 inch. In other embodiments, the flute diameter may vary from about 0.002 inch to about 0.125 inch.

The present invention is also directed to methods for drilling holes in printed circuit boards. According to these methods, a drill bit is provided as described above. Prior to using a drill bit according to the invention to form holes in the circuit board, a pilot hole may first be drilled in the circuit board. A pilot hole typically is drilled with a smaller length drill bit. The drill bit for drilling the pilot hole may be similar a drill bit according to the invention or may be another type of drill bit. The depth of the pilot hole may vary, depending upon the application. The pilot hole may vary from about 95% to about 110% of the diameter of a drill bit according to the present invention. The pilot hole may be drilled to a depth of from about 50% to about 500% of the diameter of a drill bit according to the present invention.

In some instances, in order to prevent topographical surface features of the circuit board from causing the drill for the pilot hole or the drill of the invention from being knocked off course, an entry material may be placed over the area where a hole is to be formed. Preferably, the entry material is soft and smooth. Furthermore, the entry material preferably allows the drill to start accurately without being deflected by imperfections in the circuit board surface. A preferred entry material is a sheet of thin aluminum that may be first placed over the circuit board to be drilled. This entry material is typically about 0.030 inch or less in thickness. Organic entry material may also be used. An aluminum clad organic material may also be used.

Regardless of whether or not an entry material is used or a pilot hole is drilled, a drill bit according to the invention may then be brought into contact with the surface of the circuit board in a location where it is desired to form a hole. The drill bit may be brought into contact with a surface of the circuit board by moving the drill bit and/or by moving the circuit board toward each other in a direction parallel to the longitudinal axis of the drill bit.

Rotation of the drill bit may commence either before or after bringing the drill bit into contact with the surface of the circuit board. According to preferred embodiments of the method of the invention, the drill bit may be rotated from 30,000 to about 500,000 revolutions per minute. In one embodiment in particular, the drill bit is rotated about 45,000 revolutions per minute, but could also be operated between about 30,000 and about 120,000 revolutions per minute.

Then, as stated above, at least one of the drill bit and the circuit board may be moved toward each other in a direction parallel to the longitudinal axis of the drill bit so as to move the drill bit into the circuit board, thereby causing the cutting edge 29 on the drill bit to remove material from the circuit board, thereby forming a hole in the circuit board. According to one embodiment of the method of the invention, the drill bit may penetrate the printed circuit board at about 60 inches per minute. In other embodiments, drill bits according to the invention may penetrate from between about 30 and about 400 inches per minute.

At least one of the circuit board and the drill bit may be moved away from each other in a direction parallel to the longitudinal axis of the drill bit thereby removing the drill bit from the hole formed in the circuit board.

At least one of the drill bit and the circuit board may then be moved in one or more directions perpendicular to the longitudinal axis of the drill bit, thereby positioning the drill bit over a different location on the circuit board where another hole is to be formed. A pilot hole may first be drilled in this new location or a drill bit according to the present invention may be used to form a hole without the pilot hole the above steps for forming a hole with a drill bit according to the invention may then be repeated to form another hole. The circuit board may be moved as many times as is necessary to form as many holes as desired in the circuit board. Typically, when pilot holes are used, all of the pilot holes are drilled followed by all of the through holes in a panel.

The present invention may be used when drilling holes in circuit boards formed of a variety of materials. For example, typical materials that drill bit according to the invention provides favorable results when used with include laminates from polyimides, epoxies, and bismaleamide triazines, and typically glass-reinforced lamimates. The present invention is particularly effective when drilling holes in boards including high glass transition temperature ($T_G$) resins.

Specifically, drill bits according to the present invention have been particularly effective in drilling high aspect ratio holes in one epoxy-derived, high ($T_G$) material, known by the name DRICLAD. DRICLAD is a glass-reinforced laminate comprising an epoxy available under the name 8213 from Ciba-Geigy as the binder. A typical board including DRICLAD may include thirty layers, for example. However, the present invention may be used with any printed circuit board, regardless of thickness, the number of various type of layers, and/or the material from which the board is made.

The smaller helix angle in the vicinity of the first end of the drill bit, where the cutting edge is located, may serve to thicken and shorten the material, particularly copper chips, formed by the drill passing through the circuit board, in the case of the copper chips, the conductive layers. The copper chips formed by the drill passing through the conductive layers may be continuous.

By shortening the copper chips, the velocity of the chips, in particular the velocity of the leading edges of the chips, during cutting may be reduced. Reducing the velocity of the chips may help to prevent them from impacting dielectric chips in the flute formed as the drill passes through the dielectric layers. The reduced velocity of the copper chips may also help to reduce their tendency to buckle and gouge the wall of the hole being formed by the drill.

Quickly increasing the helix angle over a relatively short distance and also including a relatively larger helix angle near the tip of the drill bit helps to cause loose chips formed by drilling through the circuit board to accelerate relatively quickly relative to the flute and decelerate with respect to the hole wall. The relatively higher helix angle also causes the loose chips, cooper, dielectric, or otherwise to move faster up the flute, thereby also helping to prevent the copper chips during cutting from impacting the chips ahead of them in the flute and buckling into the hole wall.

Reducing the velocity of the chips relative to the hole wall may have the added benefit of greatly reducing the heating and softening of the hole wall by reducing heat generated by the chips rubbing on the hole wall. Heating and softening of the hole wall can lead to poor hole quality. In fact, studies on a DRICLAD board indicated that the peak hole wall temperature reached when using a drill bit according to the present invention was reduced from approximately 400° C. to about 200° C. as compared to known commonly used drill bits for drilling holes in printed circuit boards.

An increasing helix angle with an increasing distance from the first end of the drill bit may result in a further acceleration of the chips in the flutes, thereby causing the chips to spread out over the entire length of the flute, thereby helping to prevent compaction of the chips, which can also result in the generation of a great deal of heat.

All of the above results achieved when using the variable angle single flute drill bit of the present invention help to produce a higher quality hole than known drill bits. Typically, drill bits used in forming holes in printed circuit boards include two flutes. Accordingly, the present invention has been found to exhibit a lower rate of breaking than multiple flute drill bits of a similar diameter. In fact, the single flute of the present invention permits the use of high helix angle in the flute without substantially weakening the drill or reducing the flute volume.

Breakage of drill bits according to the present invention occurs less frequently than with multiple flute drill bits as well because drill bits according to the present invention include only one cutting edge. Therefore, a drill bit according to the present invention experiences less torque as it cuts through the material of the circuit board. Although for a given bite, that is, infeed per revolution or penetration of the drill bit into a circuit board per revolution, the chips of material from circuit board are twice as thick for a single flute drill as for a double flute drill, a single flute drill does not require twice the torque since torque varies less than proportionately with an increase in feed rate. Since the cutting torque is reduced with the present invention, the torque applied to the circuit board is also reduced thereby reducing damage to the circuit board and particularly to small lands of circuit boards which can often be loosened and damaged by a drill bit.

In this disclosure, there is shown and described only the preferred embodiments of the invention, but, as aforementioned it is to be understood that the invention is capable of use in various other combinations and environments and is capable of changes or modifications within the scope of the inventive concept as expressed herein.

I claim:

1. A drill bit for forming holes in a printed circuit board, said drill bit comprising:

a first end including a tip for contacting the material of the circuit board;

a second end for attaching to apparatus for rotating said drill bit;

a cutting edge in the vicinity of said first end;

a pressure pad opposite said cutting edge; and a single flute winding upwardly about said drill bit in a helix, an angle of said helix with respect to a longitudinal axis of said drill bit varying continuously, wherein said angle is from about 15° to about 35° in the vicinity of said first end and increases with increasing distance from said first end to at least from about 35° to about 65°.

2. A drill bit according to claim 1, wherein said pressure pad extends about said drill bit less than 180°.

3. A drill bit according to claim 1, wherein said angle of said helix varies from about 28° in the vicinity of said first end to about 55° over less than one-half of a length of said flute and wherein an exit angle of said helix is about 59°.

4. A method of forming holes in a printed circuit board, said method comprising the steps of:

a) providing a drill bit including a first end including a tip for contacting the material of the circuit board, a second end for attaching to apparatus for rotating said drill bit, a cutting edge in the vicinity of said first end, a pressure pad opposite said cutting edge, and a flute winding upwardly about said drill bit in a helix, an angle of said helix with respect to a longitudinal axis of said drill bit varying continuously, wherein said angle is from about 15° to about 35° in the vicinity of said first end and increases with increasing distance from said first end to at least from about 35° to about 65°;

b) rotating said drill bit;

c) bringing said tip into contact with a surface of the printed circuit board;

d) forming a hole in said circuit board by moving at least one of said drill bit and said circuit board in a direction parallel to said longitudinal axis of said drill bit, thereby forcing said drill bit into said circuit board and causing said cutting edge of said drill bit to remove a portion of said circuit board; and e) moving at least one of said drill bit and said circuit board in a direction parallel to said longitudinal axis of said drill bit, thereby removing said drill bit from said hole.

5. A method according to claim 4, further comprising the steps of:

f) providing said pressure pad less than 180° about said drill bit.

6. A method according to claim 4, further comprising the steps of:

f) varying said angle of said helix from about 28° in the vicinity of said first end to about 55° over less than one-half of a length of said flute; and g) providing an exit angle of said helix of about 59°.

7. A method according to claim 4, further comprising the steps of:

f) moving at least one of the drill bit and the circuit board in a direction perpendicular to the longitudinal axis of the drill bit, thereby positioning the drill bit over another location on the circuit board where a hole is to be formed;

g) repeating steps b) through e); and h) repeating step f) until a desired number of holes are formed in said circuit board.

8. A method according to claim 4, wherein the drill bit is rotated at from about 30,000 to about 500,000 revolutions per minute.

9. A method according to claim 4, wherein the drill bit is rotated at about 45,000 revolutions per minute.

10. A method according to claim 4, wherein the hole is formed in the circuit board at about 60 inches per minute.

\* \* \* \* \*